(12) United States Patent
Stiedl

(10) Patent No.: US 7,848,074 B2
(45) Date of Patent: Dec. 7, 2010

(54) ELECTRONIC CIRCUIT BREAKER AND METHOD

(75) Inventor: Andreas Stiedl, Giesshuebl (AT)

(73) Assignee: Astec International Limited, Kwun Tong, Kowloon (HK)

(*) Notice: Subject to any disclaimer, the term of this patent is extended or adjusted under 35 U.S.C. 154(b) by 675 days.

(21) Appl. No.: 11/895,908

(22) Filed: Aug. 28, 2007

(65) Prior Publication Data

US 2009/0058574 A1 Mar. 5, 2009

(51) Int. Cl.
*H02H 5/00* (2006.01)
(52) U.S. Cl. .................................................. 361/103
(58) Field of Classification Search ............... 361/103
See application file for complete search history.

(56) References Cited

U.S. PATENT DOCUMENTS

| | | | | |
|---|---|---|---|---|
| 4,417,194 A | * | 11/1983 | Curtiss et al. ............... | 322/47 |
| 4,727,450 A | * | 2/1988 | Fachinetti et al. ........... | 361/103 |
| 4,752,852 A | | 6/1988 | Ahl et al. | |
| 4,945,445 A | | 7/1990 | Schmerda et al. | |
| 6,577,478 B2 | | 6/2003 | Kim et al. | |
| 6,600,641 B2 | | 7/2003 | Oglesbee et al. | |
| 7,230,813 B1 | | 6/2007 | Canova et al. | |
| 7,385,791 B2 | * | 6/2008 | Ness ............................. | 361/8 |
| 2006/0120000 A1 | | 6/2006 | Fiesoli et al. | |

FOREIGN PATENT DOCUMENTS

EP 1 294 069 4/2006

OTHER PUBLICATIONS

ETA, Electronic Circuit Breaker ESS60T; www.e-t-a.com/uploads/prodb/D_ESS6OT_e_A.pdf; Issue A; pp. 5-43 through 5-46.

* cited by examiner

*Primary Examiner*—Stephen W Jackson
(74) *Attorney, Agent, or Firm*—Harness, Dickey & Pierce, P.L.C.

(57) ABSTRACT

An electronic circuit breaker has an input, an output, and a switch electrically connected between the input and the output. The electronic circuit breaker monitors the energy dissipated by the switch and opens the switch when the energy reaches a threshold value in order to protect the switch. The electronic circuit breaker also monitors the current through the switch and opens the switch when necessary to protect the load.

25 Claims, 6 Drawing Sheets

ELECTRONIC CIRCUIT BREAKER AND METHOD

FIELD

The present disclosure relates to electronic circuit breakers.

BACKGROUND

The statements in this section merely provide background information related to the present disclosure and may not constitute prior art.

Circuit breakers have long been used to protect loads from overvoltage and overcurrent situations. Traditionally, these circuit breakers were mechanical circuit breakers. More recently, electronic circuit breakers have been introduced and are preferred to mechanical circuit breakers in certain applications.

The present inventor has recognized a need for various improvements in electronic circuit breakers.

SUMMARY

According to one aspect of the present disclosure, an electronic circuit breaker includes an input, an output, a switch and at least a circuit for controlling a current. The switch is electrically connected between the input and the output. The switch is operable to conduct the current when in a closed position and interrupt the current when in an open position. The circuit is operable to determine an energy dissipated by the switch and to place the switch in the open position when the energy dissipated by the switch reaches a threshold level.

According to another aspect of the present disclosure, a method is provided for limiting a current through a switch having at least an open position and a closed position. The switch interrupts the current in the open position and conducts the current in the closed position. The method includes determining the energy dissipated in the switch when the switch is in the closed position and generating a signal representative of the energy dissipated in the switch. The method further includes placing the switch in the open position when the signal representative of the energy dissipated in the switch reaches an energy threshold value.

According to yet another aspect of the present disclosure, an electronic circuit breaker includes an input, an output, a switch and a circuit for controlling a current. The switch is electrically connected between the input and the output and operable to conduct the current when in a closed position and interrupt the current when the switch is in an open position. The circuit is operable to determine whether the switch is in a safe operating area and to place the switch in the open position when the switch is not in the safe operating area.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
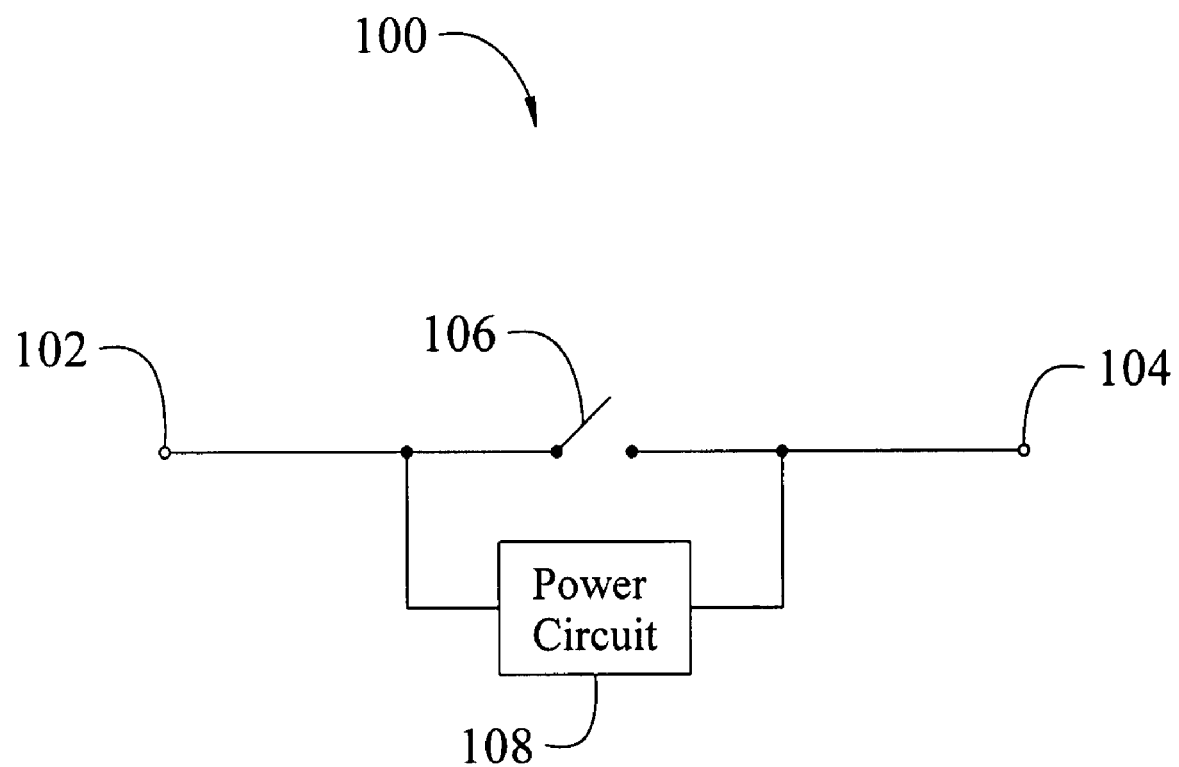
FIG. 1 is a block diagram of an electronic circuit breaker including a power limiting circuit according to one embodiment of the present disclosure.

The following description is merely exemplary in nature and is not intended to limit the present disclosure, application, or uses.

According to one aspect of the present disclosure, a method for limiting the current through a switch is given. The switch has at least an open position in which the current is interrupted and a closed position in which the current is allowed to flow through the switch. When the switch is in the closed position, the energy dissipated by the switch is determined and a signal is generated representing the energy dissipated by the switch. When the signal reaches an energy threshold value, the switch is placed in the open position and current through the switch is thereby interrupted.

By the method discussed above, the switch is protected and the switch is kept in its safe operating area. The switch does not necessarily open in response to any predetermined current level, but opens in response to an excessive amount of energy being dissipated by the switch. The switch may therefore allow a very high current to flow for a short time, such as in an inrush current situation, but will be switched to an open position if the high current continues for too long a time and the energy dissipated rises too high. When the energy dissipated by the switch reaches or exceeds an energy threshold value, the switch is placed in the open position and current, and therefore power dissipation, is interrupted. In this manner, the switch is prevented from operating outside its safe operating area and damage to the switch is avoided.

In some embodiments, the current through the switch is also limited to a predetermined current level. The method allows for high currents, such as inrush currents, but limits the current through the switch to a certain current level. The switch is thus protected from excessive currents, while still allowing limited high current conditions to exist for a limited and necessary time. The allowable current level will vary depending upon the application, the switch and the maximum current level allowable for a particular application. The predetermined current level need not be a specific predetermined value. It can be, for example, based upon a calculation, a multiple of rated current, a ratio, or any other useful relationship.

The energy dissipated by the switch may be determined in many ways. Because energy is the integral of power, integrating the power across the switch will yield the energy. One way of achieving this integration arises when the current is held relatively constant, as in some embodiments of this method. Power dissipated by the switch is determined by the voltage multiplied by the current. If the current is constant, it can be removed outside the integration of the power dissipated by the switch. Therefore, integrating the voltage across the switch yields a signal that is representative of the energy dissipated by the switch. Alternatively, a processor can be used to perform at least some of the steps of the method including the determination of the energy dissipated in the switch. A suitably powerful processor can perform the integration directly. Alternatively, the processor could use, for example, pre-calibrated tables to determine the energy dissipated.

The method can be performed by analog circuits, digital circuits or a combination of analog and digital circuits. Digital circuits can include microprocessors or other processors. When analog circuitry is used, an analog integrator circuit and comparator may be used. However, any circuits capable of performing some or all of the method may be used.

The method can further include protecting a load to which current flows through the switch. For example, the method may include integrating the difference between the current through the switch and a rated current when the switch is in the closed position and the current exceeds a threshold value. A result of the integrating is generated and compared to a trip threshold. When, and if, the result reaches the trip threshold, the switch is placed in the open position, thereby interrupting current through the switch. The threshold value determines when this occurs. The amount of current in excess of the rated current can be integrated. If the current remains over the rated current for too long, the integration result reaches the trip threshold and the switch is opened. The length of time that an overcurrent situation can exist without the switch opening can be varied to suit any particular application. As in other embodiments, the method can be performed by analog circuits, digital circuits or a combination of analog and digital circuits. The digital circuits may include a processor and the analog circuits can include integrator and comparator circuits. Digital circuits can include lookup tables to determine the trip threshold based on numerous factors including, but not limited to, voltage, current and temperature.

An electronic circuit breaker capable of performing the methods described above is illustrated in FIG. 1 and indicated generally by reference number 100. As shown in FIG. 1, the circuit breaker 100 includes an input 102, an output 104, and a switch 106 electrically connected between the input 102 and the output 104. The switch 106 has at least two positions. When moved to a first open position, the switch interrupts a flow of current between the input and the output. In a second closed position, the switch allows the current to flow between the input and the output.

As shown in FIG. 1, the electronic circuit breaker 100 also includes a power circuit 108. When the switch is in the closed position and the current exceeds a threshold value, the power circuit 108 is active. When active, the power circuit determines the energy dissipated by the switch. When the energy dissipated by the switch reaches an energy threshold level, the power circuit places the switch in the open position, thereby opening a circuit and interrupting the flow of current between the input and the output.

As discussed above, the power circuit is active when the current exceeds a threshold value. During a high inrush current condition, the power circuit also restricts the current allowed to flow through the switch, thus protecting the switch, the circuit and the load. The details of restricting the flow of current through a switch is discussed further below.

According to some embodiments of the present disclosure, the power circuit is also operable to maintain the switch in a safe operating area. Switches, whether mechanical, electrical or electro-mechanical, are designed to handle, among other things, certain voltages, currents and energy levels. To prevent damage to the switch and possible catastrophic failure, switches should be operated within this safe operating area. Whether or not the switch is in the safe operating area can be determined from numerous factors, including, without limitation, the voltage across the switch, the current through the switch, the power or energy dissipated by the switch, etc. These factors can be instantaneous measurements, historical trends or totals accumulated over time.

Figure 2:
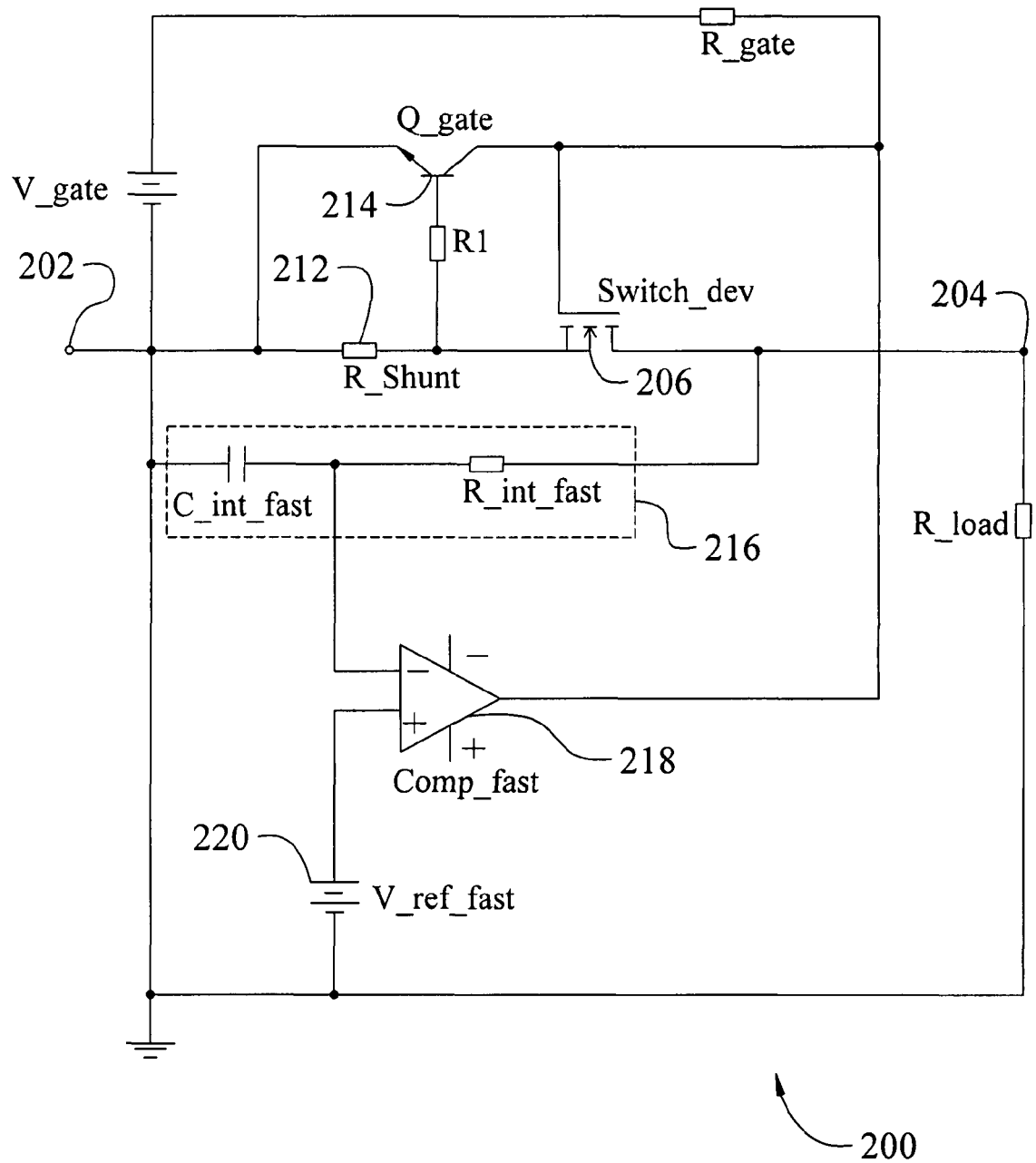
FIG. 2 is a block diagram of an electronic circuit breaker including a power limiting circuit and a current limiting circuit according to another embodiment.

FIG. 2 illustrates an analog implementation of an electric circuit breaker 200 including a power circuit according to some embodiments of the present disclosure. The electronic circuit breaker includes an input 202, an output 204 and a switch 206 electrically connected between the input and the output. While in some embodiments of the present disclosure the switch is disclosed as a MOSFET, the switch may be any mechanical, electrical or electro-mechanical switch. The power circuit includes a current detector 212, a regulation device 214, an integration circuit 216 and a comparator 218. Alternatively, a microprocessor operable to perform the same or similar functions as the analog components can be used.

When a load is connected to the electronic circuit breaker, current flows from the input, through the switch and out to the load. Certain types of loads, capacitive loads for example, require a large startup or inrush current. If too large a current is allowed to pass through the switch, the switch, the circuit breaker or the load may be damaged. In particular, the current through the switch needs to be regulated to maintain the switch operating within its safe operating area. The regulation device limits the current through the switch when the current exceeds a predetermined value above the threshold value. In FIG. 2, the regulation device is a bipolar junction transistor (BJT) and the switch is a MOSFET. When an excessive current is present, the regulation device reduces the gate voltage of the MOSFET. This reduces the conductivity of the switch and limits the current through the switch.

During this time, i.e., when the current exceeds a first threshold, the integration circuit integrates the voltage across the switch. The energy dissipated by the switch is the integral of the power dissipated by the switch, i.e., the voltage across the switch multiplied by the current through the switch. As the current is held generally constant when the power circuit is active, the current can be removed outside the integral and only the voltage across the switch needs to be integrated. The signal output from the integration is, therefore, representative of the energy dissipated in the switch. This integration and signal generation are continuous when the power circuit is active. When the signal reaches an energy threshold, the power circuit can place the switch in the open position and thereby interrupt current through the switch. The load is, therefore, permitted to draw a certain amount of current in an inrush situation and the power circuit will not open the switch unless the high level of current exists long enough for the energy dissipated by the switch to exceed a predetermined amount. If the current decreases below the first threshold without the total energy threshold having been reached, the power circuit does not interrupt the current through the switch and the integration circuit resets. Although the integration circuit is illustrated in FIG. 2 as an RC network, other types of integration circuits can be used.

As illustrated in FIG. 2, the signal from the integration circuit is compared to a reference signal. This reference signal represents the energy threshold. In FIG. 2, the reference signal is a reference voltage 220. The comparator receives the signal from the integration circuit and compares this with the reference signal. When the signal reaches or exceeds the reference signal, the energy dissipated in the switch has reached the energy threshold and the power circuit can place the switch in the open position and thereby interrupt current through the switch. The reference signal can be a fixed voltage, a voltage that is variable, a digital signal, or any other signal that can be used in a comparison.

Alternatively, the power circuit can include a microprocessor to perform some or all of the operating functions of the power circuit described above.

In the manner described above, the power circuit limits the current through the switch during an inrush condition and turns off the switch when the energy dissipated in the switch exceeds a predetermined level. The power circuit therefore protects the switch from operating outside the safe operating area and therefore protects the switch from damage. The power circuit does not, however, provide protection for the load during normal operations. Therefore, in some embodiments, the electronic circuit breaker also includes a current limiting circuit. The current circuit operates as an electronic analog to a standard mechanical circuit breaker. The current circuit will be discussed below.

Figure 3:
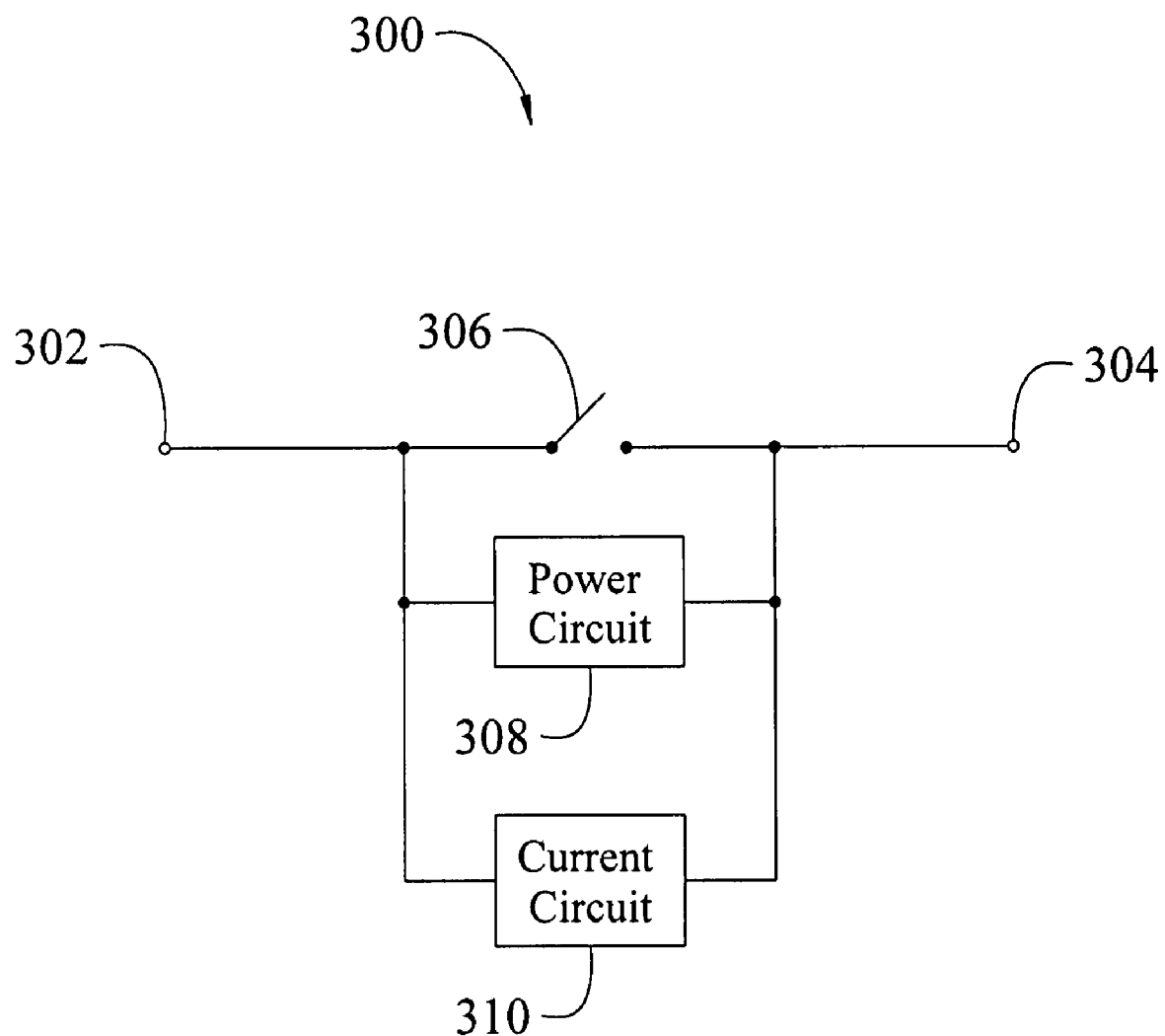
FIG. 3 is a circuit diagram of an electronic circuit breaker including a power limiting circuit according to another embodiment.

In one embodiment, an electronic circuit breaker 300 includes a current circuit 310, as illustrated in FIG. 3. The electronic circuit breaker 300 also includes an input 302, an output 304, a switch 306 and a power circuit 308. The current circuit electronically operates in a manner and with a profile similar to a mechanical circuit breaker. The current circuit generally operates to protect a load connected to the circuit breaker from abnormalities occurring during ordinary operations. The current circuit is operable to break the circuit upon the continued occurrence of an abnormal condition, such as a short circuit or overload condition. The current circuit is operable when the current exceeds a threshold value that is smaller than the threshold value of the power circuit. Thus, as the current increases from zero, the current circuit's threshold value is reached and the current circuit becomes active. As, and if, current continues to rise, the power circuit also becomes active when the current reaches its threshold value. In normal operating conditions, the current through the switch is below both threshold values and neither the current circuit nor the power circuit will be activated. When the current through the switch is between the two threshold values, only the current circuit is active. Whenever the power circuit is active, however, the current circuit is also active. When the current circuit is active, it is operable to place the switch in the open position, thereby interrupting current through the switch when a trip threshold value is reached.

Figure 4:
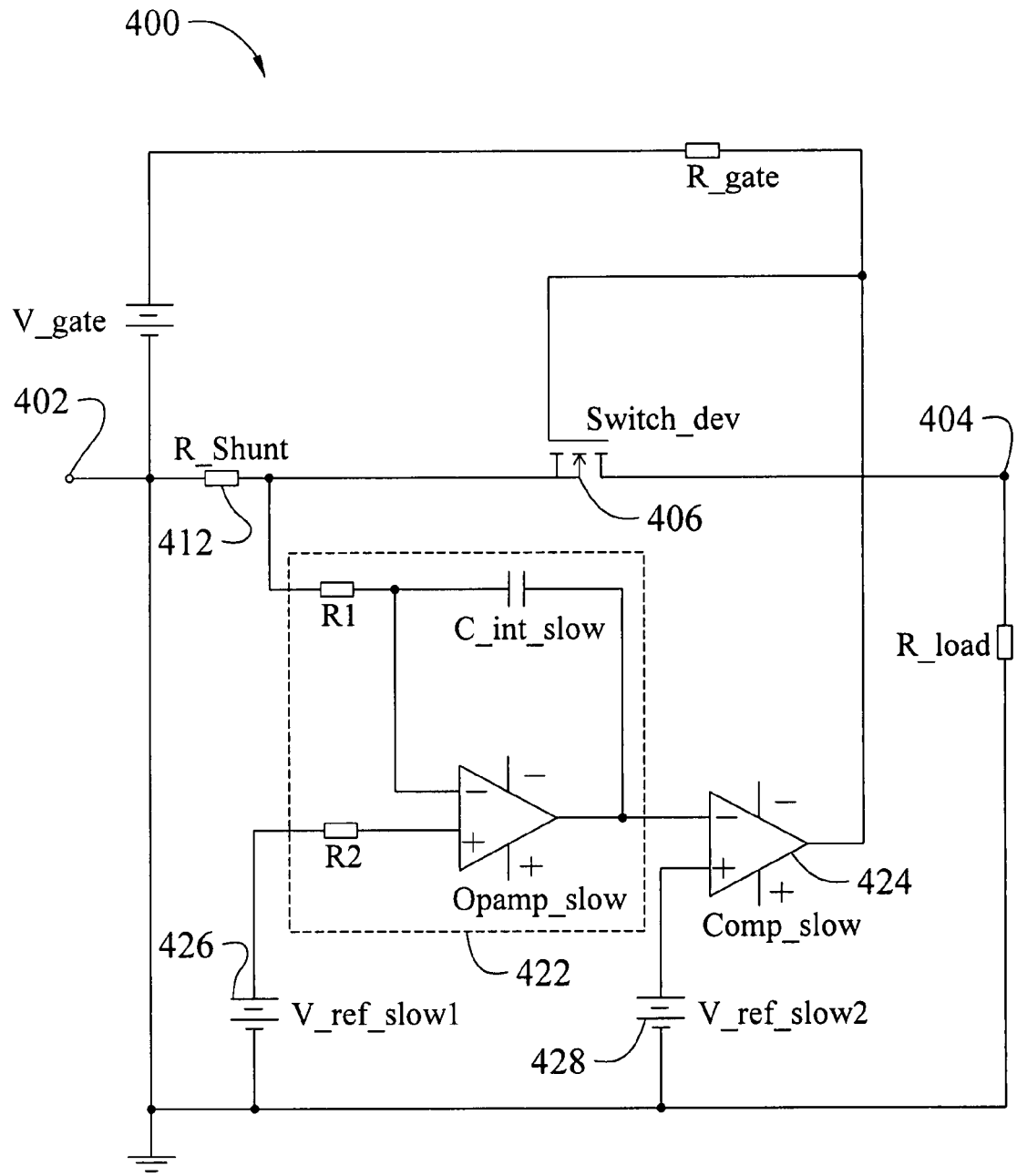
FIG. 4 is a circuit diagram of an electronic circuit breaker including a current limiting circuit according to another embodiment.

An analog implementation of an electronic circuit breaker 400 including a current circuit is illustrated in FIG. 4. The circuit breaker includes an input 402, an output 404 and a switch 406. The current circuit includes a current detector 412, an integration circuit 422, and a comparator 424.

When the current through the switch exceeds the current circuit threshold, the current circuit is active. The integration circuit integrates the value by which the current through the switch exceeds a rated current. The rated current is a predetermined value and can be a variable value. The rated current and the second threshold are set by a second reference voltage 426 in FIG. 4. The result of this integration of the excess current is then compared to a trip threshold value by the comparator. In FIG. 4, the trip threshold value is a third reference voltage 428. When the result of the integration reaches the trip threshold value, the current circuit places the switch in the open position and the current through the switch is interrupted.

Figure 5:
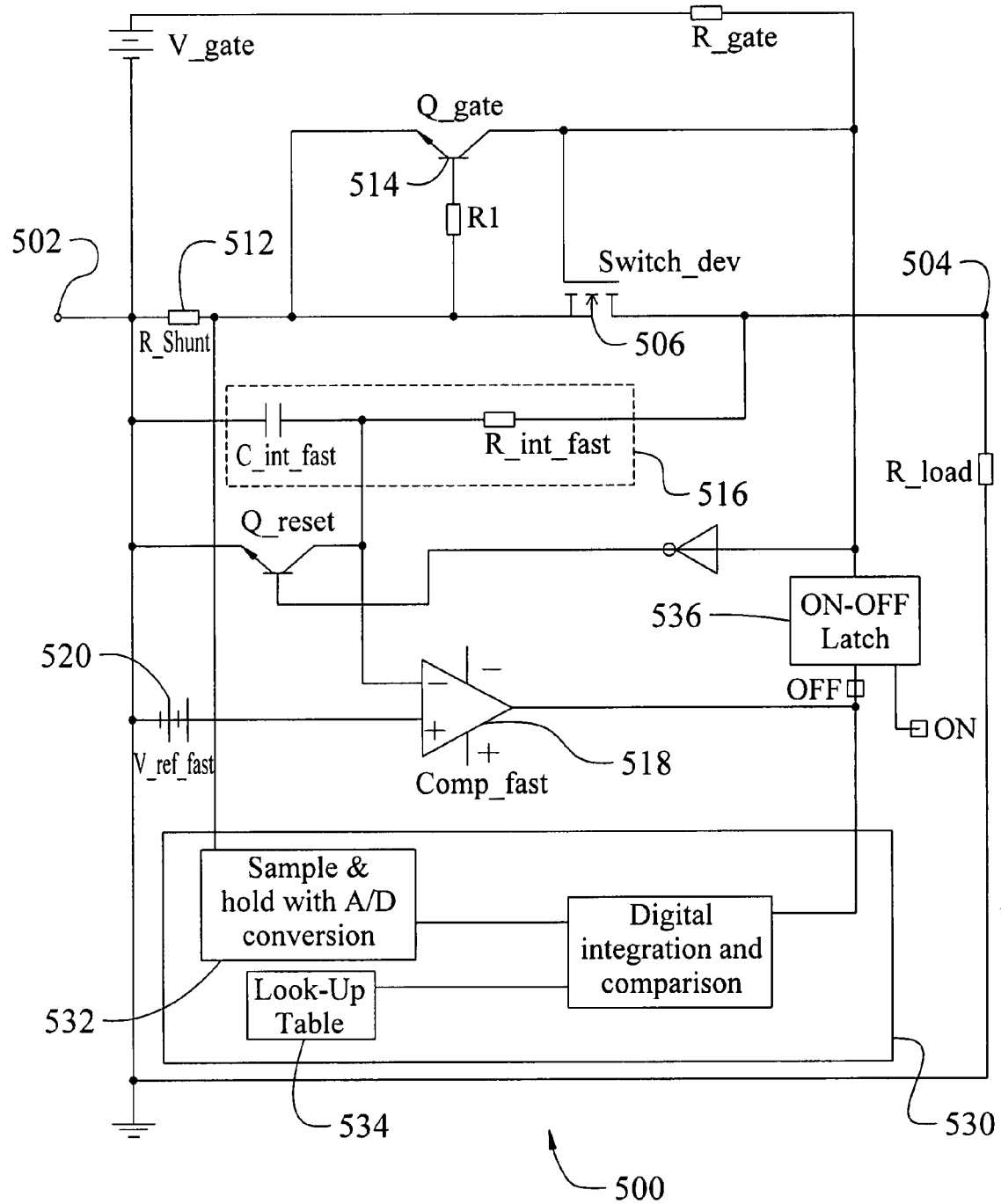
FIG. 5 is a circuit diagram of an electronic circuit breaker including a power limiting circuit and a microprocessor-based current limiting circuit.

The integration and comparison in the current circuit discussed above can be performed by an analog circuit and/or by a microprocessor. FIG. 5 illustrates an electronic circuit breaker 500 including an input 502, an output 504, a switch 506, a power circuit, and a microprocessor-based current circuit 530. The power circuit includes a current detector 512, a regulation device 514, an integration circuit 516, a comparator 518, and a reference voltage 520. The power circuit operates as discussed above. The microprocessor includes an analog to digital converter 532 which samples the current through the switch. The microprocessor also digitally performs the integration of the excess current.

When the current circuit includes a microprocessor, the trip threshold value can be a constant value or a variable value. If it is a variable value, the possible trip threshold values in some embodiments are stored in a data table 534. In such embodiments, the microprocessor is operable to look up the correct trip threshold value in the data table. Numerous factors can be considered when determining the correct trip threshold value using a microprocessor and data table including, but not limited to, voltages, currents, temperatures, etc. The microprocessor also enables the electronic circuit breaker to more closely replicate certain non-linear trip characteristics of a mechanical circuit breaker if desired. Additionally, the microprocessor may also handle additional activities. Such activities can include, for example, supervisory tasks, communication tasks, etc. Further, multiple electronic circuit breakers may share a single microprocessor-based current circuit. Such a shared current circuit performs the current circuit tasks described above for each of the multiple electronic circuit breakers.

The electronic circuit breaker also includes a latch 536. The latch receives a signal from the power circuit and/or the current circuit. When the energy dissipated in the switch reaches the energy threshold, the power circuit causes the latch to place the switch in the open position, thereby interrupting the flow of current through the switch. The current circuit is also operable to trigger the latch when the integration result reaches the trip threshold value, thereby causing the latch to place the switch in the open position and interrupting the current through the switch. The latch will hold the switch in the open position until the latch is reset. The latch can be reset and the switch returned to the closed position by application of a reset signal to the latch. This reset signal may be generated manually or automatically. In either case, the reset signal may be generated locally or from a remote location. Although the latch is included in the circuit illustrated in FIG. 5, the latch is not necessary for the circuit to function properly. An electronic circuit breaker according to this disclosure may or may not include such a latch.

Figure 6:
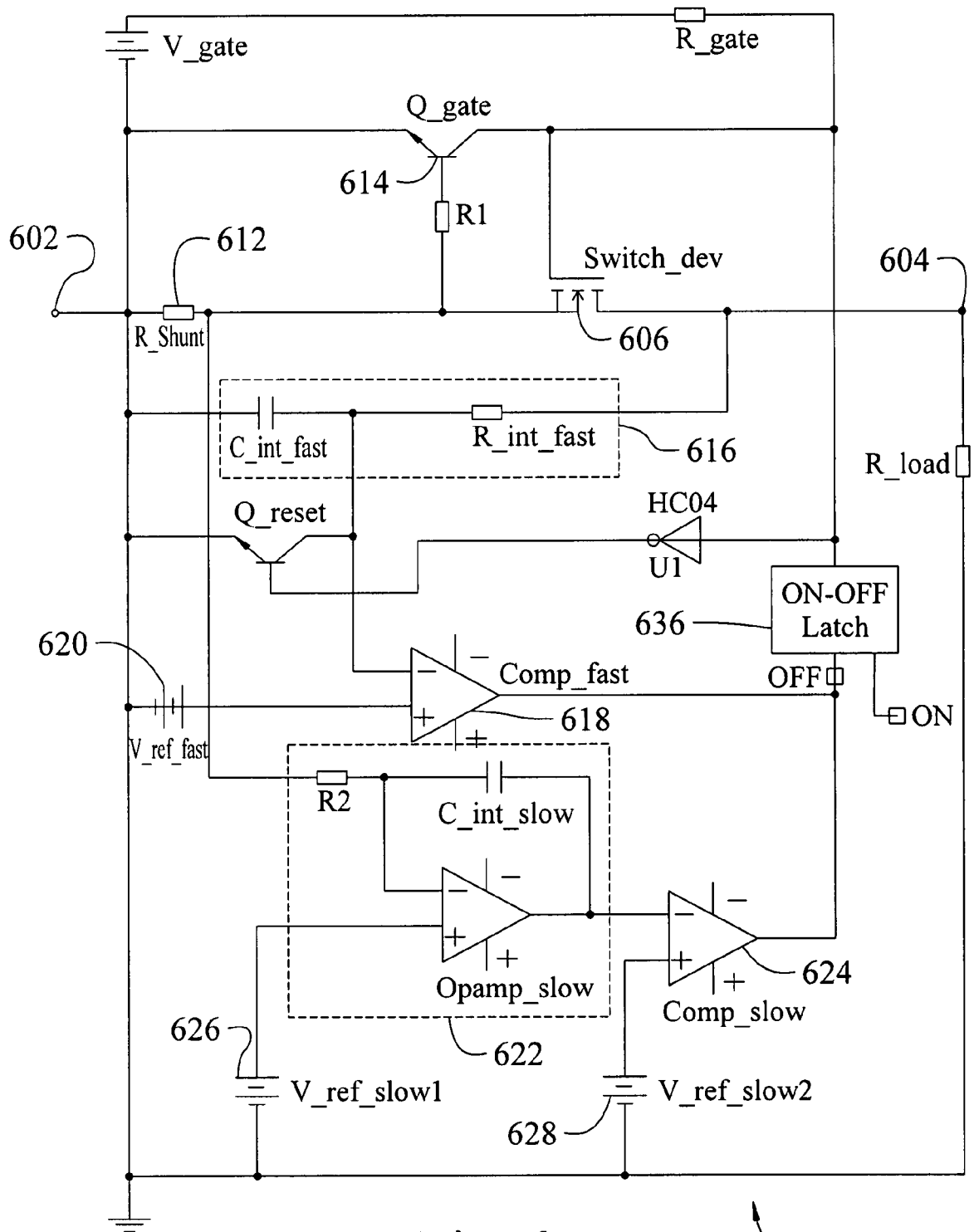
FIG. 6 is a circuit diagram of an electronic circuit breaker including a power limiting circuit and an analog current limiting circuit.

According to another embodiment, an electronic circuit breaker 600 includes an input 602, an output 604, a switch 606, an analog power circuit, and an analog current circuit as shown in FIG. 6. The analog power circuit includes a current detector 612, a regulation device 614, an integration circuit 616, and a comparator 618. The analog power circuit operates as discussed above. The analog current circuit includes the current detector, an integration circuit 622, and a comparator 624. The analog current circuit also operates as discussed above with regard to the embodiment of FIG. 4. The circuit breaker also includes a first reference voltage 620, a second reference voltage 626, and a third reference voltage 628.

The electronic circuit breaker can also include a mechanical circuit breaker (not shown). Such an embodiment provides more complete mechanical isolation and separation. In such an embodiment, the electronic circuit breaker is configured such that the mechanical circuit breaker will trip and create a mechanically open circuit in response to the switch being placed in the open position.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. An electronic circuit breaker comprising an input, an output, a switch and at least a circuit for controlling a current, the switch electrically connected between the input and the output and operable to conduct the current when in a closed position and interrupt the current when the switch is in an open position, said circuit operable to determine an energy dissipated by the switch and to place the switch in the open position when the energy dissipated by the switch reaches a threshold level.

2. The electronic circuit breaker of claim 1 wherein the circuit is operable when the current exceeds a current threshold level.

3. The electronic circuit breaker of claim 1 wherein the circuit is operable to limit the current to a predetermined value.

4. The electronic circuit breaker of claim 1 wherein the circuit is further operable to maintain the switch operating in a safe operating area.

5. The electronic circuit breaker of claim 1 wherein the circuit is operable to integrate a voltage across the switch and generate a signal representing the energy dissipated by the switch.

6. The electronic circuit breaker of claim 5 wherein the circuit is operable to compare the signal to a reference signal.

7. The electronic circuit breaker of claim 6 wherein the reference signal is a fixed voltage.

8. The electronic circuit breaker of claim 6 further comprising a latch, and wherein the reference signal represents the threshold level and the latch is operable to place the switch in the open position when the signal is substantially equivalent to the reference signal.

9. The electronic circuit breaker of claim 1 wherein the circuit includes a microprocessor.

10. The electronic circuit breaker of claim 1 further comprising a mechanical circuit breaker, the mechanical circuit breaker operable to mechanically interrupt the current in response to the switch being placed in the open position.

11. The electronic circuit breaker of claim 1 wherein the circuit comprises a power circuit and a current circuit, the current circuit operable when the current exceeds a first current threshold level, the power circuit operable when the current exceeds a second current threshold level, the current circuit operable to place the switch in the open position when a trip threshold level is reached.

12. The electronic circuit breaker of claim 11 wherein the current circuit is operable to integrate a value by which the current exceeds a rated current, compare an integration result with the trip threshold level and place the switch in the open position when the integration result reaches the trip threshold level.

13. The electronic circuit breaker of claim 11 wherein the current circuit includes a microprocessor and the microprocessor is configured to integrate a value by which the current exceeds a rated current and compare the integration result with the trip threshold value.

14. The electronic circuit breaker of claim 12 wherein the trip threshold value is variable and the possible trip threshold values are stored in a data table accessible by the microprocessor.

15. A method of limiting a current through a switch with at least an open position and a closed position, the switch interrupting the current in the open position and conducting the current in the closed position, the method comprising:
   determining the energy dissipated in the switch when the switch is in the closed position;
   generating a signal representative of the energy dissipated in the switch; and
   placing the switch in the open position when the signal representative of the energy dissipated in the switch reaches an energy threshold value.

16. The method of claim 15 wherein determining the energy dissipated in the switch includes integrating the voltage across the switch.

17. The method of claim 15 wherein determining the energy dissipated in the switch is performed when the current exceeds a threshold level.

18. The method of claim 17 further comprising restricting the current to a predetermined current level, said predetermined current level greater than the threshold level.

19. The method of claim 15 wherein determining the energy, generating the signal, and placing the switch in the open position are performed by a microprocessor.

20. The method of claim 15 wherein determining the energy and generating the signal are performed by an analog integrator circuit, and placing the switch in the open position are performed by a comparator circuit.

21. The method of claim 15 further comprising:
   integrating the difference between the current through the switch and a rated current when the switch is in the closed position and the current exceeds a threshold value;
   generating a result of the integrating;
   comparing the result to a trip threshold; and
   placing the switch in the open position when the result reaches the trip threshold.

22. The method of claim 21 wherein integrating the difference, generating the result, comparing the result and placing the switch in the open position are performed by a microprocessor.

23. The method of claim 22 wherein comparing the result to the trip threshold includes looking up the trip threshold in a data table.

24. The method of claim 21 wherein integrating the voltage and generating the result are performed by an analog integrator circuit and comparing the signal and placing the switch in the open position are performed by a comparator circuit.

25. An electronic circuit breaker comprising an input, an output, a switch and at least a circuit for controlling a current, the switch electrically connected between the input and the output and operable to conduct the current when in a closed position and interrupt the current when the switch is in an open position, said circuit operable to determine whether the switch is in a safe operating area based on one of a voltage across the switch, a current through the switch, a power dissipated by the switch, and an energy dissipated by the switch, and to place the switch in the open position when the switch is not in the safe operating area.

* * * * *